(12) United States Patent
Farnworth

(10) Patent No.: US 6,527,041 B1
(45) Date of Patent: Mar. 4, 2003

(54) METHODS AND APPARATUS FOR FORMING SOLDER BALLS

(75) Inventor: Warren M. Farnworth, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/580,759

(22) Filed: May 30, 2000

Related U.S. Application Data

(62) Division of application No. 09/210,517, filed on Dec. 11, 1998.

(51) Int. Cl.[7] .............................................. B22D 11/06
(52) U.S. Cl. ........................ 164/429; 164/271; 164/339; 128/246
(58) Field of Search ................................. 164/429, 479, 164/271, 80, 137, 339; 228/246, 254

(56) References Cited

U.S. PATENT DOCUMENTS

| | | | | |
|---|---|---|---|---|
| 5,343,926 A | * | 9/1994 | Cheskis et al. | 164/429 |
| 5,586,715 A | * | 12/1996 | Schwiebert et al. | 228/248.1 |
| 6,025,258 A | * | 2/2000 | Ochiai et al. | 438/613 |
| 6,056,191 A | * | 5/2000 | Brouillette et al. | 228/254 |

* cited by examiner

Primary Examiner—Tom Dunn
Assistant Examiner—I.-H. Lin
(74) Attorney, Agent, or Firm—Fletcher, Yoder & Van Someren

(57) ABSTRACT

Methods and apparatus for forming a plurality of uniformly sized solder balls utilize a stencil having a plurality of holes of uniform volume disposed on a substrate. Solder is disposed in the holes of the stencil on the substrate. Typically, the solder is in the form of solder paste which is distributed into the holes using a squeegee. While within the holes of the stencil on the substrate, the solder is melted to form solder balls. The stencil may then be removed to leave the solder balls on the substrate, or the solder balls may be removed while the stencil remains on the substrate.

15 Claims, 3 Drawing Sheets

METHODS AND APPARATUS FOR FORMING SOLDER BALLS

This application is a Divisional of application Ser. No. 09/210,517 filed Dec. 11, 1998.

BACKGROUND OF THE INVENTION

1. Field of the Invention

The present invention relates generally to electrical circuitry and, more particularly, to methods and apparatus for forming solder balls.

2. Description of the Related Art

In the fabrication of electrical circuits, it is often desirable to couple a circuit component to a substrate. For example, an integrated circuit chip may be coupled to a ceramic substrate or to a printed circuit board. A method commonly used for the surface mounting of a circuit component involves the placement of solder balls between the circuit component and the substrate. The assembly is then heated to melt the solder balls to couple the circuit component to the substrate.

To facilitate this type of surface mounting technique, the height of the solder balls should be substantially uniform. If the height of the solder balls is not uniform, the smaller balls may fail to wet, i.e., adhere, to either the circuit component or the substrate, thus causing the failed formation of the desired electrical connection. Due to the criticality of the size of the solder balls, various techniques have been used in an effort to obtain uniform solder balls.

Most commonly used methods of forming solder balls employ a stencil and operate quite similarly to a screen printing process. The stencil includes a pattern of holes which are formed in it, and each of these holes define a volume that is substantially identical to each other hole. The hole pattern typically corresponds with a pattern of electrical contacts to be formed between the circuit component and the substrate.

In this process, solder is applied in the form of solder particles, such as tin/lead particles, which are held together in a flux paste. The stencil is placed over and slightly spaced above the substrate, so that the holes in the stencil are positioned over the contact pads on the substrate. Once in position, the solder paste is placed on the stencil. As a squeegee moves along the stencil and over the holes, it deposits the solder paste into the holes and presses the stencil into contact with the substrate below. When the stencil flexes back into position spaced above the substrate, it leaves plugs of solder paste on the contact pads of the substrate. After the squeegee has completed its stroke along the stencil, the stencil is removed. The substrate is then heated so that the solder reflows to form solder balls which adhere to the contact pads.

The general technique described above suffers from various drawbacks. First, the holes in a stencil should be of uniform size and volume, otherwise the solder balls will not be of uniform size. Second, if a flexible squeegee, such as a rubber squeegee, is used, the squeegee tends to "scoop out" a small portion of the solder paste near the top of each hole in the stencil because the flexible material tends to flex downwardly into each hole. The "scoop out" alters the desired volume of solder paste, thus affecting the ultimate size of the solder balls created. Third, some of the solder paste tends to stick to the walls of the holes of the stencil. Thus, when the stencil flexes back into position to leave a plug of solder paste on the substrate, the volume of solder paste left on the substrate tends to be less than the volume of the hole in the stencil. Indeed, the variations between the plugs of solder left on the substrate may be quite significant, thus precluding the formation of a number of balls having uniform size.

In an effort to address this first problem, various types of methods have been used to create uniform holes in stencils. For instance, the holes in some stencils are formed by performing a chemical etch from both sides of the stencil. While the holes formed in this manner tend to be quite uniform, chemically etched stencils unfortunately tend to have holes bordered by small cusps. These cusps tend to retain the solder paste, which eventually plugs the holes in the stencil during repeated use. Alternatively, lasers may be used to cut holes having straight walls in a stencil. Such holes tend to be very uniform in size and they tend to retain less solder paste than holes cut with the chemical etching process. Nonetheless, laser cut holes will retain some solder paste and eventually become plugged as well.

In an effort to address the second problem, relatively inflexible squeegees, such as metal squeegees, have been utilized. Although relatively inflexible squeegees solve the problem of "scoop out," such inflexible squeegees tend to stretch the stencil, thus slightly altering the volume and position of each hole and, eventually, rendering the stencil useless.

In an effort to address the third problem, E-fab stencils have been developed. E-fab stencils have trapezoidally or frustroconically shaped holes that widen toward the bottom of the stencil. Due to the shape of the holes, E-fab stencils tend to plug less frequently than the chemical etch or laser cut stencils mentioned above. However, due to the manner in which all stencils are used, some solder paste still sticks to the walls of the openings as the stencil is removed. Thus, regardless of the type of stencil used, the solder paste builds up on the stencil walls so that the plugs of solder paste remaining on the substrate after stencil removal become smaller or nonexistent with repeated use of the stencil.

The present invention may address one or more of the problems discussed above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided an apparatus for forming solder balls. The apparatus includes a substrate and a stencil disposed on the substrate. The stencil has a plurality of holes extending therethrough.

In accordance with another aspect of the present invention, there is provided an apparatus for forming solder balls. The apparatus includes a non-wettable substrate having an upper surface and a non-wettable stencil having an upper surface and a lower surface. The lower surface of the stencil is disposed on the upper surface of the substrate. The stencil has a plurality of holes having uniform volume extending from the upper surface of the stencil through the lower surface of the stencil.

In accordance with still another aspect of the present invention, there is provided a system for forming solder balls. The system includes a conveyor belt having a first surface and a second surface and having a plurality of holes in the first surface extending partially through the conveyor belt. A drive device is coupled to the conveyor belt to move the conveyor belt along a given path. A solder dispensing device is arranged relative to the conveyor belt to dispense solder within the holes in the first surface of the conveyor belt. A heating device is positioned downstream of the solder dispensing device and arranged relative to the conveyor belt to melt the solder within the holes in the first surface of the conveyor belt to form a plurality of solder balls.

In accordance with yet another aspect of the present invention, there is provided a plurality of uniformly sized solder balls fabricated by disposing solder paste into a like plurality of uniformly sized holes in a stencil disposed on a substrate and by melting the solder paste in the like plurality of uniformly sized holes to form the plurality of solder balls.

In accordance with a further aspect of the present invention, there is provided a method of forming solder balls. The method includes the acts of: (a) providing a stencil disposed on a substrate, the stencil having a plurality of holes therein; (b) disposing solder within the plurality of holes; and (c) heating the solder disposed within the holes of the stencil disposed on the substrate to form a solder ball within each hole.

BRIEF DESCRIPTION OF THE DRAWINGS

The foregoing and other advantages of the invention may become apparent upon reading the following detailed description and upon reference to the drawings representing exemplary embodiments in which.

DESCRIPTION OF SPECIFIC EMBODIMENTS

Figure 1:
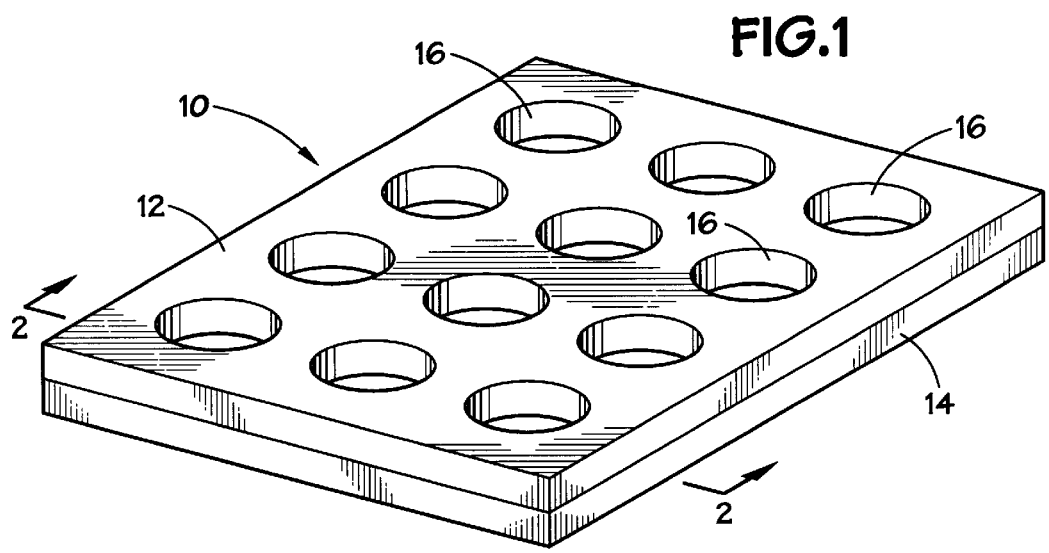
FIG. 1 illustrates a stencil disposed on a substrate.

Turning now to the drawings, and referring initially to FIG. 1, an apparatus for forming solder balls is illustrated and generally designated by the reference numeral 10. The apparatus includes a stencil 12 and a substrate 14. The stencil 12 includes a plurality of holes 16 formed therethrough. Unlike the conventional techniques for forming solder balls discussed above, the stencil 12 is disposed on the substrate 14 and it is not removed from the substrate 14 prior to solder ball formation. Rather, as discussed in detail below, solder paste is disposed in the holes 16 of the stencil 12, and the apparatus 10 is heated to melt and reflow the solder paste into solder balls.

Figure 2:
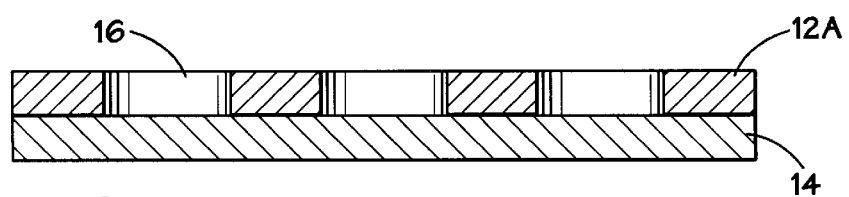
FIG. 2 illustrates a cross-section of the apparatus of FIG. 1 taken along line 2—2.
Figure 3:
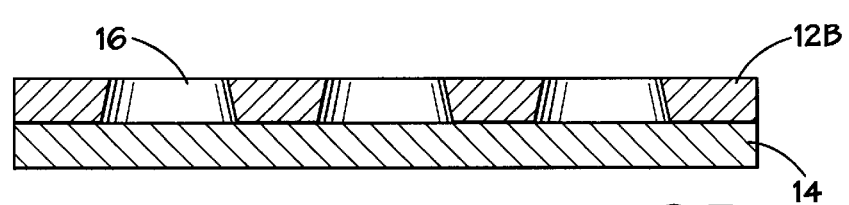
FIG. 3 illustrates an alternate cross-section of the apparatus of FIG. I taken along line 2—2.
Figure 4:
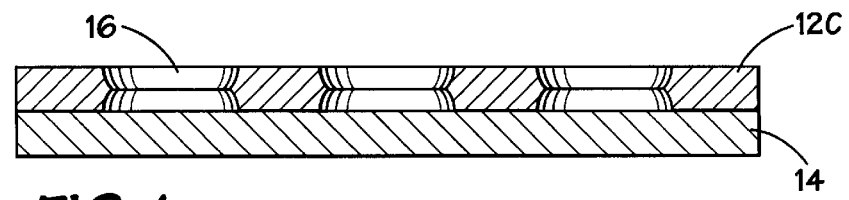
FIG. 4 illustrates another alternate cross-section of the apparatus of FIG. I taken along line 2—2.

Because the stencil 12 remains on the substrate 14 during the formation of the solder balls, it does not remove paste from the substrate 14 that would otherwise be used to form solder balls. Because of this, any suitable stencil having uniform holes may be used. For example, the stencil 12 may be a laser cut stencil 12A as illustrated in FIG. 2, an E-fab stencil 12B as illustrated in FIG. 3, or a chemically etched stencil 12C as illustrated in FIG. 4. It should be noted that a gasket (not shown) or similar intermediate layer may be disposed between the stencil 12 and the substrate 14.

Figure 5:
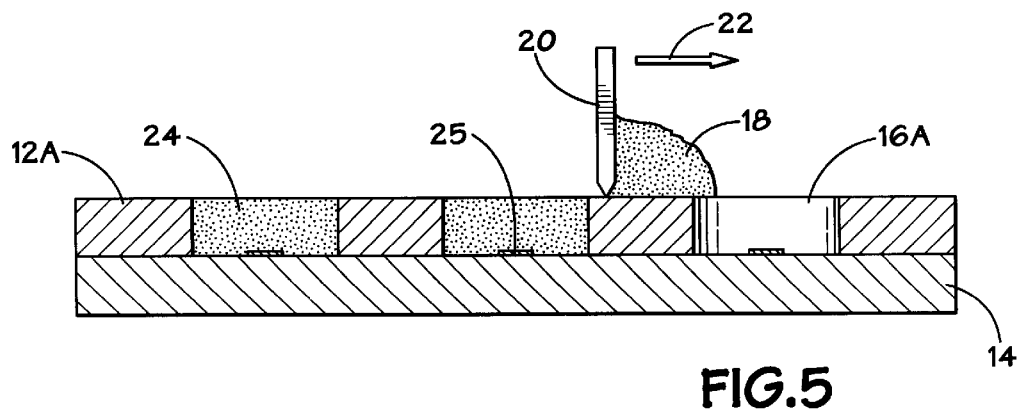
FIG. 5 illustrates the cross-sectional view of FIG. 2 during the deposition of solder paste in the holes of the stencil.

Using the laser cut stencil 12A of FIG. 2 as an example, FIG. 5 illustrates the deposition of solder paste 18 into the holes 16A of the stencil 12A. Although any suitable method may be used, the solder paste 18 is advantageously placed on the stencil 12A, and a squeegee 20 moves generally in the direction of the arrow 22 to deposit the solder paste 18 within the holes 16A of the stencil 12A. The solder paste 18 may be of any suitable configuration, such as tin/lead solder particles held together within a flux paste. Regardless of whether the squeegee 20 is made of a relatively flexible material or a relatively inflexible material, "scoop out" is substantially reduced or eliminated due to the fact that the stencil 12A is not spaced above the substrate 14 and flexed into contact with the substrate 14 during the deposition of the solder paste 18 on the substrate 14. Furthermore, the use of a relatively inflexible squeegee 20 does not tend to stretch the stencil 12A for these same reasons. Thus, either type of squeegee may be used without the disadvantages of either found in the conventional techniques.

Figure 6:
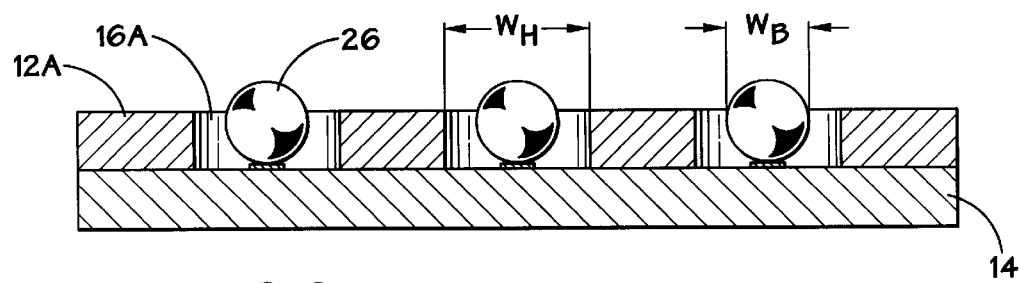
FIG. 6 illustrates the formation of solder balls in the apparatus of FIG. 1.

As illustrated in FIG. 5, the solder paste 18 deposited in each hole 16A forms a solder plug 24. Because the holes 16A in the stencil 12A have been formed, using known techniques, so that they are quite uniform with respect to one another, each solder plug 24 is likewise uniform with one another. The apparatus 10 is then heated to a temperature sufficient to melt or reflow the solder plugs 24 so that they form solder balls 26, as illustrated in FIG. 6. It should be noted that the stencil 12A is advantageously made of a non-wettable material, such as stainless steel or titanium, so that none of the solder adheres to the walls of the holes 16A during the formation of the solder balls 26.

Figure 7:
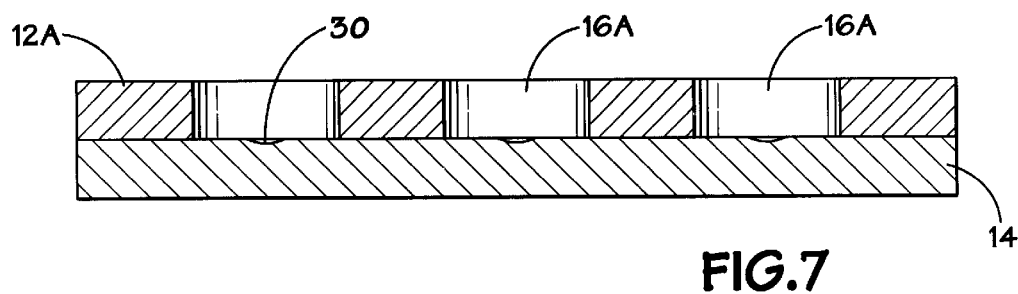
FIG. 7 illustrates a cross-sectional view of the apparatus of FIG. 1 taken along line 2—2 illustrating an alternate substrate configuration.

Although the solder balls 26 are typically small, e.g., 10 to 30 thousandths of an inch in diameter, and thus quite light, the weight of the solder balls 26 may nonetheless cause the bottom of the solder balls 26 to flatten against the flat substrate 14. To facilitate the fabrication of more spherical solder balls, a substrate 14A, as illustrated in FIG. 7, having spherical indentations 30 aligned with the holes 16 may be implemented. The spherical indentations 30 conform to the spherical shape of the solder balls 26 to spread the weight of the solder balls 26 more evenly to reduce the tendency of the solder balls 26 to flatten as they might on a flat substrate.

Referring again to FIGS. 5 and 6, the holes 16 of the stencil 12 may be aligned with respective contact pads 25 on the substrate 14, and the stencil 12 may be clamped to the substrate 14 during formation of the solder balls 26. Once the solder balls 26 have been formed and coupled to the wettable contact pads 25, the stencil 12 may be unclamped and removed from the substrate 14. It should also be noted that the width $W_H$ of the openings 16A is larger than the width $W_B$ of the solder balls 26, thus allowing the stencil 12A to be removed from the substrate 14 without disturbing the solder balls 26.

However, if the object of the solder ball formation is to produce a mass quantity of uniformly sized solder balls 26, the stencil 12 may remain clamped to e substrate 14, or even formed integrally with the substrate 14, In this instance, the substrate 14 is made of a non-wettable material and does not include wettable pads 25 since the solder balls 26 are to removed from the apparatus 10 after formation rather than coupled to the substrate 14.

Figure 8:
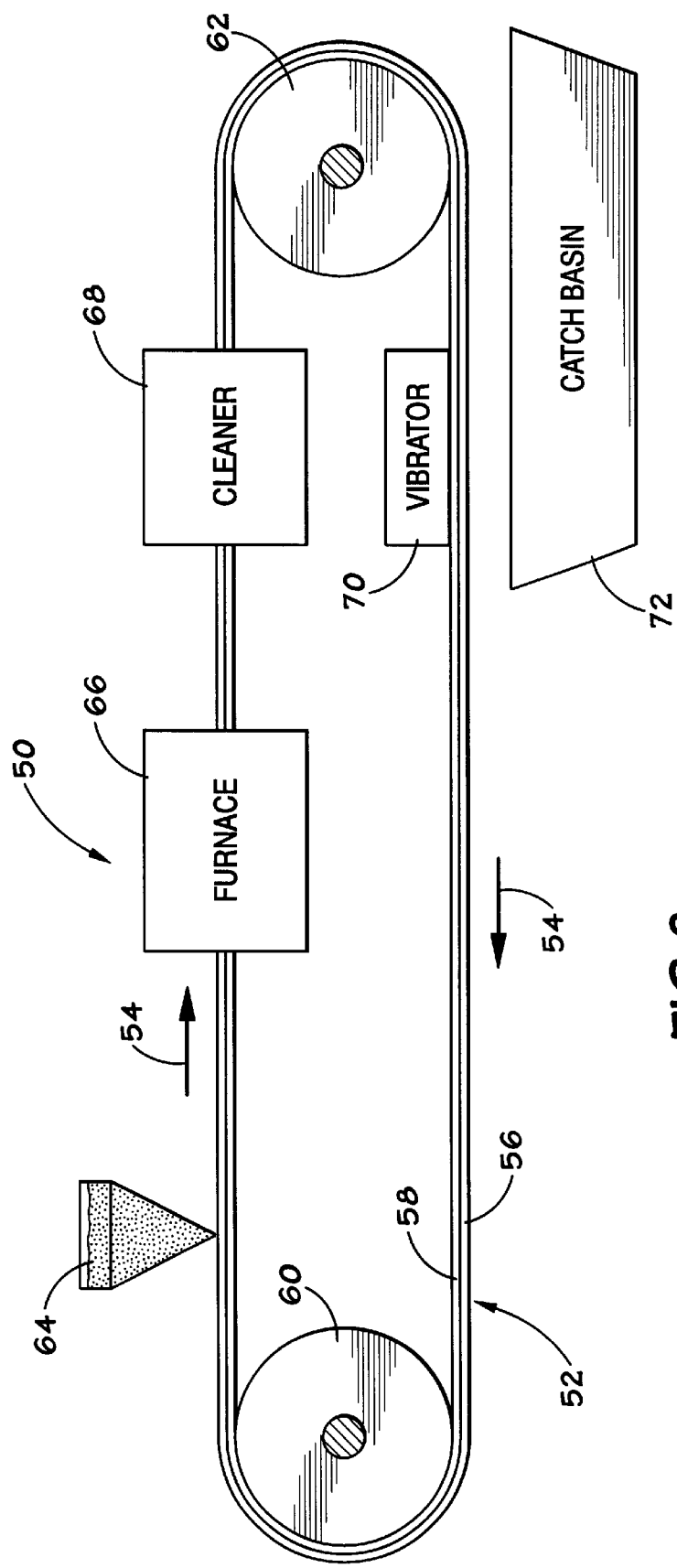
FIG. 8 illustrates a schematic diagram of an apparatus for continuously fabricating solder balls.

Although the fixtures described above are quite useful in the fabrication of uniformly sized solder balls, mass production of uniformly sized solder balls may be facilitated by a more automated system. One example of an automated conveyor-type system is illustrated in FIG. 8 and generally designated by the reference numeral 50. The system 50 utilizes a conveyor belt 52 that generally moves in the direction of the arrows 54. The conveyor belt 52 includes an upper section 56 that resembles the stencil 12 discussed above. In other words, the upper portion 56 is made of a non-wettable material and it includes a plurality of uniformly sized holes. The holes are advantageously spaced quite closely together to maximize the number of solder balls formed by the system 50. The conveyor belt 52 also includes a lower portion 58 that is substantially solid and also made of a non-wettable material. The conveyor belt 52 is schematically illustrated as being disposed about and driven by rollers 60 and 62, although it will be understood that any suitable configuration and drive means may be used.

A paste dispenser/receptacle and squeegee 64 deposits solder paste in the holes of the upper portion 56 of the conveyor belt 52 as it passes by. Then the conveyor belt 52 loaded with the solder paste enters a furnace 66, which melts the solder paste to form solder balls within the holes in the upper portion 56 of the conveyor belt 52. From the furnace 66, the solder balls continue into a cleaner 68 which removes the flux used in the formation of the solder balls. As the belt 52 continues around the roller 62, a vibrator 70 transfers the solder balls from the conveyor belt 52 into a catch basin 72. The catch basin 72 is advantageously filled with water to cool the solder balls. The conveyor belt 52 continues in the direction of the arrows 54 until it reaches the paste dispenser and squeegee 64 so that the process may be repeated.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system for forming solder balls comprising:

a conveyor belt having a surface having a plurality of receptacles therein;

a drive device coupled to the conveyor belt to move the conveyor belt along a given path;

a solder dispensing device arranged relative to the conveyor belt to dispense solder within the plurality of receptacles in the surface of the conveyor belt; and a heating device positioned downstream of the solder dispensing device and arranged relative to the conveyor belt to melt the solder within the receptacles to form a plurality of solder balls.

2. The system, as set forth in claim 1, wherein the conveyor belt comprises a first portion and a second portion, the first portion comprising a non-wettable substrate having an upper surface and the second portion comprising a non-wettable stencil having an upper surface and a lower surface, the lower surface of the stencil being disposed on the upper surface of the substrate, the stencil having a plurality of holes therein to form the plurality of receptacles, each of the plurality of receptacles having a substantially uniform volume extending from the upper surface of the stencil through the lower surface of the stencil.

3. The system, as set forth in claim 1, wherein the conveyor belt comprises a non-wettable material.

4. The system, as set forth in claim 1, wherein the receptacles in the conveyor belt are all of uniform size.

5. The system, as set forth in claim 1, wherein the receptacles in the conveyor belt are all of uniform volume.

6. The system, as set forth in claim 1, wherein each of the plurality of receptacles in the conveyor belt have a width greater than a diameter of a solder ball formed within each respective receptacle.

7. The system, as set forth in claim 1, wherein the conveyor belt comprises one of stainless steel and titanium.

8. The system, as set forth in claim 1, wherein the drive device comprises a pair of rollers about which the conveyor belt is disposed, at least one of the pair of rollers being driven to move the conveyor belt along the given path.

9. The system, as set forth in claim 1, wherein the solder dispensing device comprises a container for holding a supply of solder paste.

10. The system, as set forth in claim 1, wherein the solder dispensing device comprises a squeegee positioned adjacent the surface of the conveyor belt to deposit the solder paste within the receptacles in the surface of the conveyor belt.

11. The system, as set forth in claim 1, wherein the heating device comprises a furnace through which the conveyor belt passes.

12. The system, as set forth in claim 1, further comprising a cleaning device positioned downstream of the heating device and arranged relative to the conveyor belt to clean the solder balls.

13. The system, as set forth in claim 1, further comprising a catch basin positioned downstream of the heating device and arranged relative to the conveyor belt to receive solder balls transferred from the conveyor belt.

14. The system, as set forth in claim 1, further comprising a transfer device positioned downstream of the heating device and arranged relative to the conveyor belt to discharge the solder balls from the conveyor belt.

15. The system, as set forth in claim 14, wherein the transfer device comprises a vibrator which vibrates the conveyor belt to discharge the solder balls from the conveyor belt.

\* \* \* \* \*